United States Patent [19]

Sasano et al.

[11] Patent Number: 4,618,873
[45] Date of Patent: Oct. 21, 1986

[54] THIN FILM DEVICE

[75] Inventors: Akira Sasano, Tokyo; Kouichi Seki, Hachioji; Hideaki Yamamoto, Tokorozawa; Toru Baji, Kodaira; Toshihisa Tsukada, Tokyo, all of Japan

[73] Assignee: Hitachi, Ltd., Tokyo, Japan

[21] Appl. No.: 621,683

[22] Filed: Jun. 18, 1984

[30] Foreign Application Priority Data

Jun. 16, 1983 [JP] Japan ................... 58-106798

[51] Int. Cl.$^4$ ............................. H01L 29/78
[52] U.S. Cl. .......................... 357/23.7; 357/2; 357/51
[58] Field of Search .............. 357/2, 4, 23.7, 67 S, 357/71 S, 71 P, 51

[56] References Cited

U.S. PATENT DOCUMENTS 4,181,913  1/1980  Thornburg ................ 357/2
4,297,721 10/1981  McKenny ................. 357/51
4,451,328  5/1984  Dubois .................. 357/67 S

OTHER PUBLICATIONS

Physical Review B, vol. 13, #8, Apr. 15, 1976, pp. 3495–3505, by Wey.

Primary Examiner—Andrew J. James
Assistant Examiner—Mark Prenty
Attorney, Agent, or Firm—Antonelli, Terry & Wands

[57] ABSTRACT

In a thin film device having a hydrogenated amorphous silicon film, a metal layer is formed on the hydrogenated amorphous silicon film and then the metal layer is removed. A resulting reaction layer formed on the hydrogenated amorphous silicon film is used as a resistor.

13 Claims, 9 Drawing Figures

THIN FILM DEVICE

BACKGROUND OF THE INVENTION

The present invention relates to a thin film device which uses a hydrogenated amorphous silicon (a-Si:H) thin film, and more particularly to a thin film device having a high resistance region.

FIG. 1 shows a circuit diagram of a prior art matrix driving contact type linear sensor array (see U.S. Pat. No. 4,369,372 or Japanese Utility Model Application Laid-Open No. 53,760/82). In FIG. 1, numeral 101 denotes a blocking diode used for switching of matrix drive, numeral 102 denotes a photo-diode for photo-electric conversion and numerals 103 and 104 denote drive terminals. The blocking diode 101 and the photo-diode 102 are PIN-junction diodes formed in a common process using amrophous silicon and have a current versus voltage characteristic as shown in FIG. 2. A forward current rises at approximately 0.6 V, and in a backward direction, a break-down occurs at approximately −50 V. When a static electricity having a voltage larger than the break-down voltage $V_B$ is applied to the diode in the reverse direction, the I-layer is broken and the PIN-junction diode is shorted, as experimentarily provided. In handling the sensor of FIG. 1, if the terminal 106 is touched by a charged hand while the terminal 105 is connected, a current flows along a path shown by an arrow and the blocking diode 108 and the photo-diode 110 which are device-biased are broken while the forward-liquid photo-diode 110 and blocking diode 111 are not influenced.

A potential of a human body charged by chemical texture reaches up to 10,000 V. If a hand of a worker charged to such a high potential contact to the terminal 106, a number of picture elements (comprising combination of blocking diodes and photo-diodes) are broken by the path shown and a yield in the test of the device or mounting to apparatus is significantly lowered.

SUMMARY OF THE INVENTION

FIG. 3 shows an equivalent circuit diagram of an improved linear sensor array of the type disclosed in Japanese Patent Application No. 159,614/82 filed on Sept. 16, 1982 (inventors: T. Bajietal). Numeral 1 denotes a photo-diode, numeral 2 denotes a blocking diode, numeral 3 denotes a drive terminal, numeral 4 denotes a circuit for preventing break-down by a static electricity, numeral 5 denotes a diode of a clamp circuit and numeral 6 denotes a resistor of the circuit 4. Instead of the diode of the clamp circuit, a field effect transistor having a gate and a drain (or source) shorted may be used.

In this linear sensor array, the resistance 6 of the circuit 4 must be relatively high such as 10 KΩ. Even if a conductive material having a relatively high resistance is used as a wiring material, a sheet resistance thereof is 5 Ω/□ and a long wiring of 10 μm in width and 20 mm in length is required. On the other hand, when a high resistance material such as cermet is used, a step to manufacture the resistor 6 is required and a manufacturing cost increases.

It is an object of the present invention to provide a thin film device which enables the formation of a resistance region having a high resistance and a small area without increasing the number of steps.

In order to achieve the above object, in the present invention, a metal layer is formed on an a-Si:H film, then it is removed, and a reaction product layer on the a-Si:H is used as a resistor more particularly, when a metal layer of Cr, Ni, Ti, V, W, Pt, Mo or Ta is formed on the a-Si:H film and then removed, an interfacial reaction layer which is transparent at a first glance is formed. This reaction product layer is used as the resistor.

DESCRIPTION OF THE PREFERRED EMBODIMENTS

Embodiment 1

Figure 1:
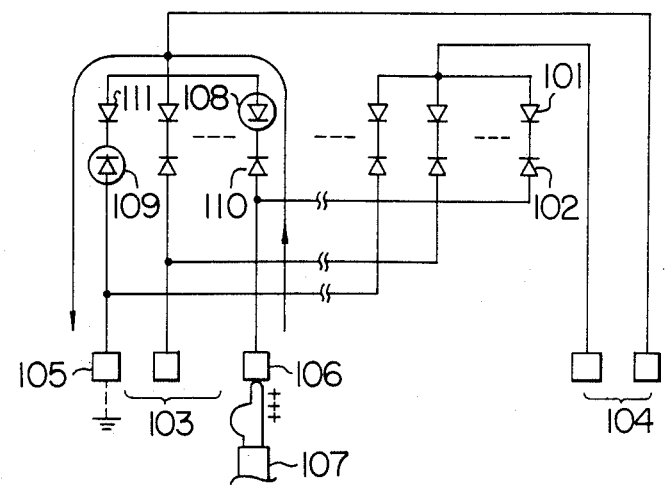
FIG. 1 is a circuit diagram of a prior art matrix drive contact read type linear sensor array.
Figure 2:
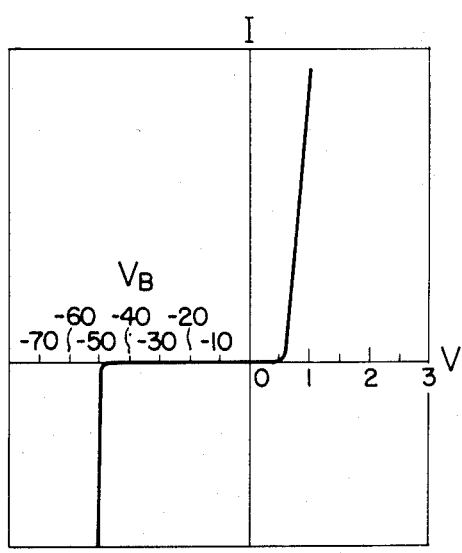
FIG. 2 is current-voltage characteristic curve of a PIN diode used in FIG. 1.
Figure 3:
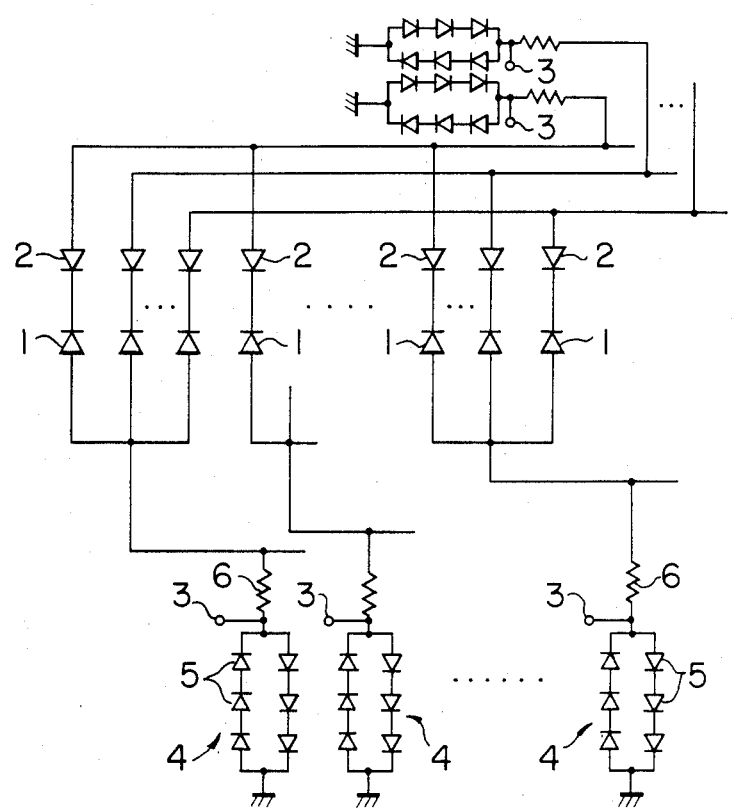
FIG. 3 is an equivalent circuit diagram of a matrix drive linear sensor array for a facsimile, having a circuit for preventing break-down by a static electricity.
Figure 4:
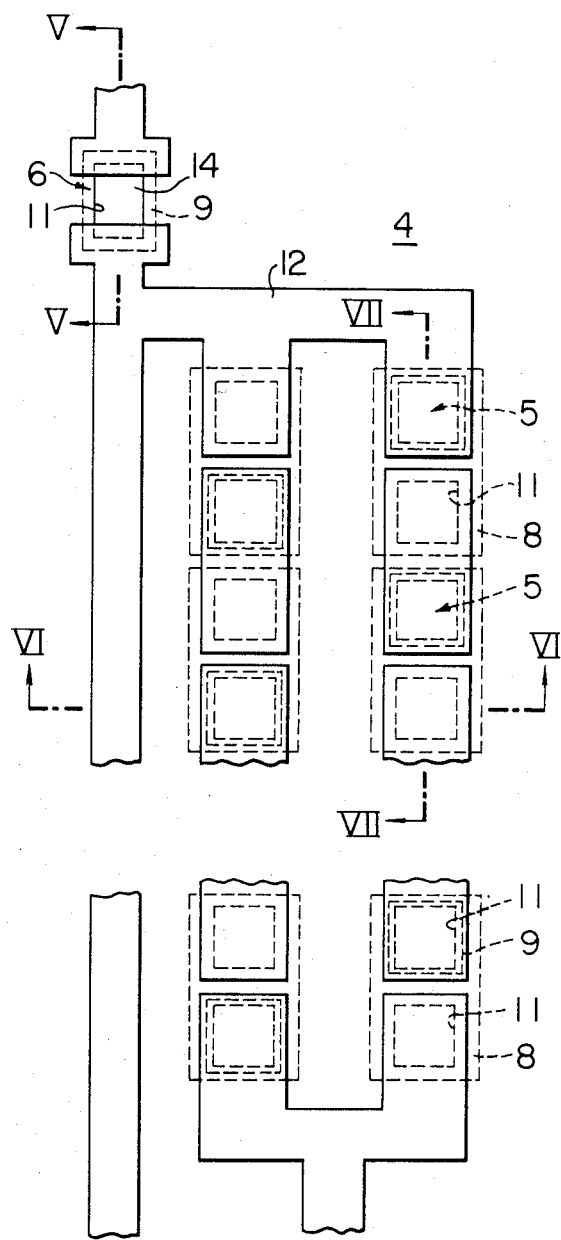
FIG. 4 is a plan view of the circuit for preventing breakdown by the static electricity in the matrix drive linear sensor array for the facsimile, in accordance with the present invention.
Figure 5:
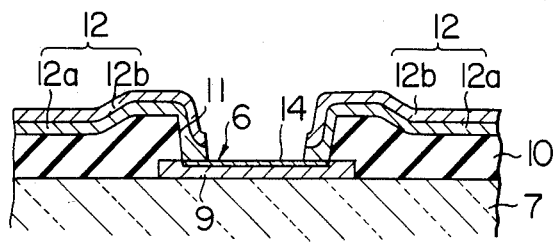
FIG. 5 is a sectional view taken along a line V—V in FIG. 4.
Figure 6:
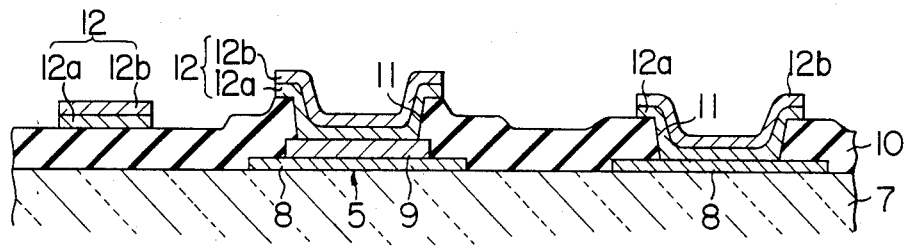
FIG. 6 is a sectional view taken along a line VI—VI in FIG. 4.
Figure 7:
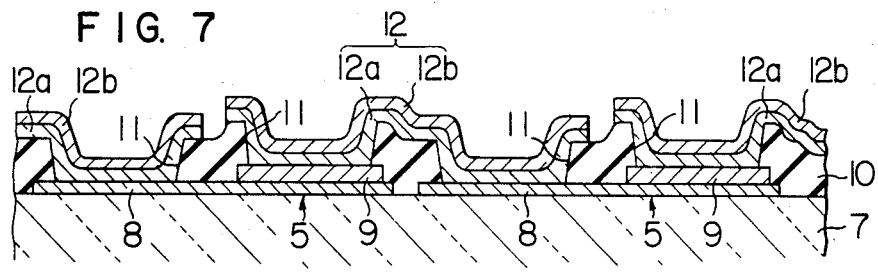
FIG. 7 is a sectional view taken along a line VII—VII in FIG. 4.

FIG. 4 is a plan view of a circuit for preventing break-down by a static electricity for a matrix drive linear sensor array for a facsimile, in accordance with the present invention, FIG. 5 is a sectional view taken along a line V—V of FIG. 4, FIG. 6 is a sectional view taken along a line VI—VI of FIG. 4 and FIG. 7 is a sectional view taken along a line VII—VII of FIG. 4. Numeral 7 denotes a glass substrate, numeral 8 denotes a Cr lower electrode, numeral 9 denotes a hydrogenated amorphous silicon (a-Si:H) film, numeral 10 denotes a SiO$_2$ insulating film, numeral 11 denotes a contact hole formed in the insulating film 10 and numeral 12 denotes an upper electrode or interconnection layer which comprises a Cr film 12a and an Al film 12b. Numeral 14 denotes a reaction layer formed on the a-Si:H film 9. It is formed by forming the Cr film 12a of the upper electrode 12 on the a-Si:H film 9 and then removing the Cr film 12. It is used as a resistor 6.

A method for manufacturing the circuit for preventing the break-down is now explained. First, Cr is evaporated on the glass substrate 7 and it is photo-etched to form the lower electrode 8. Then, the a-Si:H is deposited by a CVD (chemical vapor deposition) method and it is formed into a desired pattern by a plasma etching method using CF$_4$ gas to form the a-Si:H film 9. Then, the insulating film 10 is deposited by a sputter deposition method and the contact hole 11 is formed by a photo-etching method. The glass substrate 7 is then heated to a temperature of 50° to 200° C. and the Cr film 12a is deposited by an evaporation method and then the Al film 12b is deposited. It is then formed into a desired pattern by the photo-etching method to form the upper electrode 12. A mixture of phosphoric acid and acetic acid is used as an etching solution for Al and aqueous solution of ceric ammonium nitrate (450 g/l) is used as an etching solution for Cr. As a result, the reaction layer 14 is formed on the a-Si:H film 9 and it has a sheet resistance of approximately 10 k$\Omega$/□.

The reaction layer 14 can also be used as a transparent electrode of the photo-diode 1. The resistor 6 may be inserted at any point between the photo-diode 1 and the terminal 3 or between the blocking diode 2 and the terminal 3.

Embodiment 2

Figure 8:
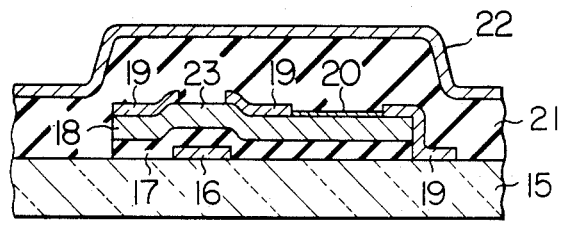
FIGS. 8 and 9 are sectional views of thin film transistor of the present invention.

FIG. 8 is a sectional view of a thin film field effect transistor of the present invention. Numeral 15 denotes a glass substrate, numeral 16 denotes a Cr under gate electrode, numeral 17 denotes a $Si_3N_4$ gate insulating film, numeral 18 denotes an a-Si:H active layer, numeral 19 denotes a double layer metal film comprising a Cr lower layer and an Al upper layer (which are used as source, drain and interconnection), and numeral 20 denotes a reaction layer formed on the a-Si:H active layer 18. The reaction layer 20 is formed by forming a Cr layer through, for example, evaporation on the active layer 18 and then removing it in a predetermined pattern. It is used as a load resistance. Numeral 21 denotes a passivation film and numeral 22 denotes a shading layer.

A method for manufacturing the thin film transistor is now explained. First, Cr is evaporated on the glass substrate 15 and it is photo-etched to form the under gate electrode 16. Then, a $Si_3N_4$ film is deposited by a plasma CVD method using a gas mixture of $SiH_4$, $NH_3$ and $N_2$ gases and the gas is changed to $SiH_4$ gas to form the a-Si:H film which is not intentionally doped with impurities. Then, it is formed into a desired pattern by a plasma etching method using $CF_4$ gas to form the gate insulating film 17 and the active layer 18. Then, the glass substrate 15 is heated to a temperature of 50° to 200° C. Cr is evaporated thereon and then Al is evaporated thereon and they are photo-etched to form the double layer metal film 19. The reaction layer 20 with the Cr lower layer of the double layer metal film 19 is formed on the a-Si:H active layer 18. Since the reaction layer is also formed on an area 23, the reaction layer on the area 23 is etched away by $HF:HNO_3:H_2O(1:1:30)$ solution. Finally, the passivation film 21 is formed and the shading layer 22 is formed.

Figure 9:
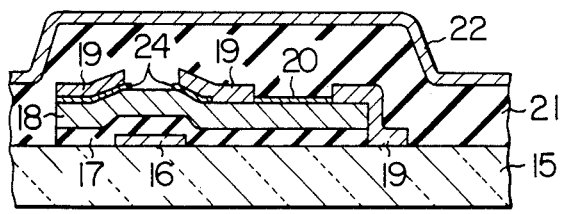

In the thin film transistor shown in FIG. 8, the a-Si:H active layer 18 having no impurity doped is directly contacted to the double layer metal film 19 (Cr lower layer). By forming an n-type a-Si:H layer 24 between the the active layer 18 and the double layer metal film 19 as shown in FIG. 9, the contact to the double layer metal film 19 is improved. Instead of removing the extra reaction layer on the area 23, an insulating film may be previously formed on the area 23. While only one thin film transistor is shown in the present embodiment, the reaction layer may be used as a resistor in an integrated circuit of a plurality of transistors.

While the circuit for preventing the break-down by the static electricity in the linear sensor array and the load resistance of the thin film resistor have been described, it should be understood that the present invention is applicable to other portions of the circuit. While the Cr layer is formed on the a-Si:H film in the above embodiment, the metal layer may be made of Cr, Ni, Ti, V, W, Pt, Mo or Ta or a mixture or an alloy thereof or an alloy of above metal and other metal such as Cr-Al, Cr-Ni or Cr-Ni-Al. The metal layer may be 300 to 2000 Å in thickness and preferably 500 to 2000 Å. If the metal layer is too thin, the uniformity is degraded. If the metal layer is too thick, no specific advantage is offered. In the above embodiments, the glass substrates 7 and 15 are heated to 50° to 200° C. Alternatively, the heat treatment may be carried out after the formation of the metal layer. In this case, the heat treatment temperature is preferably 100° to 250° C. The temperature above 250° C. is not desirable because the a-Si:H starts to degenerate. The heat treatment time may be 20 minutes to one hour although it depends on the heat treatment temperature. Too long heat treatment time does not offer a specific advantage. By removing the surface of the a-Si:H film to remove the surface oxide layer immediately before the metal film is formed on the a-Si:H film, the sample is heated to 60° to 70° C. by the heat from the metal evaporation source without special heat treatment and the reaction layer is formed. The conductivity type of the a-Si:H film may be p, i or n and the a-Si:H film may include impurity such as P, B, N, C or O. When Cr, Ni, Ti, Ta or Mo is used as the metal layer, it shows a good adhesion to a glass such as $SiO_2$. Thus, by using it as an under-layer of Al or Au electrode or interconnection having a relatively low adhesion and a low resistance, the reliability of the electrode or interconnection can be improved.

As described hereinabove, in the thin film device of the present invention, the metal layer for the electrode or interconnection is formed on the a-Si:H film and it is etched into a desired pattern and the metal layer on the a-Si:H film is removed. Thus, the reaction layer is formed and it is used as the resistor. In this manner, the resistor is formed without increasing the number of steps. Since the sheet resistance of the reaction layer is high, the resistor with high resistance and small area can be formed.

We claim:

1. A thin film device having an amorphous silicon film formed on a substrate and a reaction layer formed by a reaction between a metal film formed on said amorphous silicon film and said amorphous silicon film, said reaction layer serving as a resistor.

2. A thin film device according to claim 1, wherein said metal film contains at least one metal selected from a group consisting of Cr, Ni, Ti, V, W, Pt, Mo and Ta and said reaction layer is formed by an interfacial reaction by said metal film and said amorphous silicon film.

3. A thin film device according to claim 1, wherein said metal film consists of a plurality of layers and said reaction layer is formed between the lowermost metal layer and said amorphous silicon film.

4. A thin film device according to claim 1, wherein said metal film is pqrtly removed to provide a resistive layer of said reaction layer and the remaining metal film is present to serve as conductors in electrical contact with opposite ends of said resistive layer.

5. A thin film device according to claim 1, wherein said amorphous silicon film is a hydrogenated amorphous silicon film.

6. A thin film device according to claim 1, wherein a field effect transistor is formed at another portion of said amorphous silicon film, said field effect transistor having source and drain electrodes of metal films formed in spaced relation on said amorphous silicon film and a gate electrode formed on said amorphous silicon film with an insulating film being interleaved therebetween.

7. A thin film device according to claim 6, wherein one of said source and drain electrodes is connected to one end of said resistor.

8. A thin film device according to claim 1, wherein said amorphous silicon film is formed as an island region on said substrate, a second island region of an amorphous silicon film is formed at another portion on said substrate and a diode is formed in said second island region.

9. A thin film device according to claim 8, wherein said diode comprises a p-type layer, an i-type layer and an n-type layer formed in the amorphous silicon film in said second island region.

10. A thin film device according to claim 9, wherein a conductive layer of one of electrodes of said diode extends to said reaction layer on the amorphous silicon film in said first island region.

11. A thin film device according to claim 10, wherein said conductive layer is a metal film and said reaction layer is formed by an interfacial reaction of said metal film and said amorphous silicon film.

12. A thin film device according to claim 1, wherein the metal film is deposited on said amorphous silicon film by evaporation to a thickness of from 300 to 2000 Å and the deposited metal film is subjected to a heat treatment at a temperature of from 50° to 250° C.; said amorphous silicon film being a hydrogenated amorphous silicon film.

13. A thin film device according to claim 12, wherein said metal film is formed of chromium.

* * * * *